United States Patent
Dinger

(10) Patent No.: US 6,495,839 B1
(45) Date of Patent: Dec. 17, 2002

(54) MICROLITHOGRAPHY PROJECTION OBJECTIVE AND PROJECTION EXPOSURE APPARATUS

(75) Inventor: Udo Dinger, Oberkochen (DE)

(73) Assignee: Carl-Zeiss Stiftung, Heidenheim (DE)

( * ) Notice: Subject to any disclaimer, the term of this patent is extended or adjusted under 35 U.S.C. 154(b) by 0 days.

(21) Appl. No.: 09/523,297

(22) Filed: Mar. 10, 2000

(30) Foreign Application Priority Data

Mar. 11, 1999 (DE) .......................... 199 10 724

(51) Int. Cl.⁷ .......................... G21K 5/00; G03F 7/213; G02B 17/06
(52) U.S. Cl. ...................... 250/492.2; 378/34; 359/359; 359/366; 359/856; 359/857; 359/858; 359/861
(58) Field of Search .................... 250/492.2; 378/34; 359/359, 366, 856, 857, 858, 861

(56) References Cited

U.S. PATENT DOCUMENTS

| | | | |
|---|---|---|---|
| 5,063,586 A | 11/1991 | Jewell et al. | 378/34 |
| 5,153,898 A | 10/1992 | Suzuki et al. | 378/34 |
| 5,315,629 A | 5/1994 | Jewell et al. | 378/34 |
| 5,686,728 A | 11/1997 | Shafer | 250/492.2 |
| 5,815,310 A | 9/1998 | Williamson | 359/365 |
| 6,072,852 A * | 6/2000 | Hudyma | 250/492.2 |
| 6,199,991 B1 * | 3/2001 | Braat | 359/365 |

FOREIGN PATENT DOCUMENTS

| | | |
|---|---|---|
| EP | 422 853 B1 | 4/1991 |
| EP | 480 617 A2 | 4/1992 |
| EP | 779 528 A2 | 6/1997 |
| JP | 7-283116 | 10/1995 |

OTHER PUBLICATIONS

Jewell, T., "Optical system design issues in development of projection camera for EUV lithography," Proc. SPIE 2437:340–346 (1995).

* cited by examiner

Primary Examiner—Jack Berman
(74) Attorney, Agent, or Firm—Marshall, Gerstein & Borun

(57) ABSTRACT

The invention is concerned with a microlithography projection objective device for short wavelength microlithography, preferably <100 nm, with a first mirror (S1), a second mirror (S2), a third mirror (S3), a fourth mirror (S4) and a fifth mirror (S5). The invention is characterized by the fact that the image-side numerical aperture (NA) is greater than or equal to 0.10 and that the mirror closest to the object to be illuminated, preferably the wafer, is arranged in such a way that the image-side optical free working distance corresponds at least to the used diameter (D) of the mirror closest to the wafer; the image-side optical free working distance is at least the sum of one-third of the used diameter (D) of the mirror closest to the wafer and a length which lies between 20 mm and 30 mm; and/or the image-side optical free working distance is at least 50 mm, preferably 60 mm.

17 Claims, 3 Drawing Sheets

MICROLITHOGRAPHY PROJECTION OBJECTIVE AND PROJECTION EXPOSURE APPARATUS

FIELD OF THE INVENTION

The invention relates to a microlithography objective, a projection exposure apparatus containing the objective, and a method of manufacturing an integrated circuit using the same.

BACKGROUND OF THE INVENTION

Using a lithography system operating with wavelengths below 193 nm for imaging structures of below 130 nm resolution has been proposed. In fact, such lithography systems have been suggested for the extreme ultraviolet (EUV) range with wavelengths of $\lambda=11$ nm or $\lambda=13$ nm producing structures of below 100 nm. The resolution of a lithographic system is described by the following equation:

$$RES=k_1 \cdot \lambda/NA,$$

where $k_1$ is a specific parameter of the lithographic process, $\lambda$ is the wavelength of the incident light, and NA is the image-side numerical aperture of the system. For example, if one assumes a numerical aperture of 0.2, then the imaging of 50 nm structures with 13 nm radiation requires a process with $k_1=0.77$. With $k_1=0.64$, the imaging of 35 nm structures is possible with 11 nm radiation.

For imaging systems in the EUV region, substantially reflective systems with multilayer coatings are available as optical components. Preferably multiple layers of Mo/Be are used as multilayer coating systems for systems operating at $\lambda=11$ nm, whereas Mo/Si systems are used for $\lambda=13$ mm. With the reflectivity of the multilayer coatings approximating 70%, it is desirable to use as few optical components as possible in applications such as EUV projection objective microlithography to achieve sufficient light intensity. Specifically, to achieve high light intensity and to allow for the correction of imaging errors, systems with six mirrors and a numerical aperture (NA)=0.20 have been used.

The six-mirror systems for microlithography have become known from the publications U.S. Pat. No. 5,686,728, EP 779,528 and U.S. Pat. No. 5,815,310. The projection lithography system according to U.S. Pat. No. 5,686,728 has a projection objective with six mirrors, where each of the reflective mirror surfaces has an aspherical form. The mirrors are arranged along a common optical axis in such a way that an obscuration-free light path is achieved. Since the projection objective known from U.S. Pat. No. 5,686,728 is used only for UV light with a wavelength of 100–300 nm, the mirrors of this projection objective have a very high asphericity of approximately ±50 µm as well as very large angles of incidence of approximately 38°. Even after reducing the numerical aperture to NA=0.2, an asphericity of 25 µm from peak to valley remains, with little reduction in the the angle of incidence. Such asphericities and angles of incidence are not practicable in the EUV region according to the present state of the art because of the higher requirements on surface quality and reflectivity of the mirrors in these latter systems.

Another disadvantage of the objectives disclosed in U.S. Pat. No. 5,686,728, which precludes their use with wavelengths below 100 nm such as the 11 nm and 13 nm wavelengths desirable for EUV microlithography, is the short distance between the wafer and the mirror lying closest to the wafer. This short distance allows only very thin mirrors to be used in the U.S. Pat. No. 5,686,728 apparatus. Because of the extreme stresses on the coatings of the multilayer systems suitable for the 11 nm and 13 nm wavelengths in question, such thin mirrors are very unstable.

A projection objective with six mirrors for use in EUV lithography, even at wavelengths of 13 nm and 11 nm, has become known from EP 779,528. This projection objective also has the disadvantage, however, that at least two of the six mirrors have very high asphericities of 26 and 18.5 µm. Furthermore, in the EP 779,528 arrangement, the optical free working distance between the mirror next to the wafer and the wafer is so small that either instabilities occur or a negative mechanical free working distance is obtained.

Four-mirror projection objectives have become known from the following publications:

U.S. Pat. No. 5,315,629

EP 480,617

U.S. Pat. No. 5,063,586

EP 422,853

In U.S. Pat. No. 5,315,629, a four-mirror projection objective with NA=0.1, 4×, 31.25×0.5 mm² is claimed. From EP 480,617, two NA=0.1, 5×, 25×2 mm² systems have become known. The system according to U.S. Pat. No. 5,063,586 and EP 422,853 have a rectangular image field of at least 5×5 mm². These generally decentered systems exhibit very high distortion values. Therefore, the objectives can only be used in steppers with distortion correction on the reticle. However, the high level of distortion makes such objectives impractical at wavelengths below 100 nm.

From U.S. Pat. No. 5,153,898, overall arbitrary three to five-multilayer mirror systems have become known. The disclosed embodiments, however, all describe three-mirror systems with a rectangular field and small numerical aperture (NA<0.04). Therefore, the systems described therein can only image structures above 0.25 µm in length. The distortion of most examples lies in the µm range.

Furthermore, reference is made to T. Jewell: "Optical system design issues in development of projection camera for EUV lithography", Proc. SPIE 2437 (1995) and the citations given there, the entire disclosure of which is incorporated by reference.

Thus, it is desirable to provide a projection objective suitable for lithography with short wavelengths, preferably smaller than 100 nm, which does not have the disadvantages of the state of the art mentioned above, and which has as few optical elements as possible and a sufficiently large numerical aperture.

SUMMARY OF THE INVENTION

According to the invention, the short comings of the prior art are overcome by using a projection objective device which has five mirrors. By omitting a mirror from the known six-mirror systems—according to the five-mirror system of the invention—one can achieve a transmission which is at least 30% higher at wavelengths in the EUV region, if a reflectivity of the multilayer coating system of 70% is assumed for this radiation. In addition, numerical apertures of NA>0.10 can be realized. The five-mirror objective according to the invention is thus characterized by high resolution, low manufacturing costs and high throughput.

In a first embodiment of the invention, the mirror closest to the wafer is arranged in such a way that the image-side numerical aperture NA is greater than or equal to 0.10. Furthermore, the mirror closest to the wafer is arranged such that (1) the image-side free optical working distance corresponds at least to the used diameter of the mirror closest to the wafer, (2) the image-side optical free working distance is at least the sum of one-third of the used diameter of the mirror closest the wafer and a length which lies between 20 and 30 mm, and/or (3) the image-side optical free working distance is at least 50 mm. Preferably, the optical free working distance is 60 mm.

In a second embodiment of the invention, the image-side numerical aperture NA is greater than or equal to 0.10, the annular field width W at the wafer lies in the region 1.0 mm≦W, and the peak-to-valley deviation, A, of the aspheres is limited with respect to the best-fitting sphere in the useful region on all mirrors, by:

$$A \leq 24 \ \mu m - 129 \ \mu m (0.20 - NA) - 2.1 \ \mu m/mm(2 \ mm - W).$$

In a preferred embodiment, the peak-to-valley deviation A of the aspheres on all mirrors is limited by:

$$A \leq 9 \ \mu m - 50 \ \mu m (0.20 - NA) - 0.4 \ \mu m/mm(2 \ mm - W).$$

In a third embodiment of the invention, with a numerical aperture in the range NA≧0.10 and an image-side width of the annular field in the range W≧1 mm, the angles of incidence, AOI, on all mirrors, relative to the normal of the surface of a given mirror, is limited by:

$$AOI \leq 22° - 2°(0.20 - NA) - 0.3°/mm(2 \ mm - W).$$

Combinations of the above may also be used according to the invention. For example, in a preferred embodiment, all three conditions are fulfilled, i.e., the free optical working distance is more than 50 mm at NA greater than 0.10 and the peak-to-valley deviation of the aspheres as well as the angles of incidence in the region defined above.

The asphericities herein refer to the peak-to-valley (PV) deviation, A, of the aspherical surfaces with respect to the best fitting sphere in the used area. The aspherical surfaces are approximated in the examples by using a sphere with center on the figure axis vertex of the mirror and which intersects the asphere in the upper and lower endpoint of the used area in the meridian section. The data regarding the angles of incidence always refer to the angle between the incident rays and the normal to the surface at the points of incidence. The largest angle of any incident light ray occurring on any of the mirrors is always given, i.e., the angle of a bundle-limiting ray. The used diameter will be defined here and below as the envelope circle diameter of the used area, which is generally not circular.

Preferably, the wafer-side optical free working distance is 60 mm.

The objective can be used not only in the EUV, but also at other wavelengths, without deviating from the scope of the invention. In any respect, however, to avoid degradation of image quality, especially degradation due to central shading, the mirrors of the projection objectives should be arranged so that the light path is obscuration-free. Furthermore, to provide easy mounting and adjusting of the system, the mirror surfaces should be designed on a surface which shows rotational symmetry to a principal axis (PA). Moreover, to have a compact design with an accessible aperture stop and to establish an obscuration-free path, the projection objective devices are designed to produce an intermediate image. It is preferred that the system include of a first and second subsystem, where a real intermediate image is formed by the first subsystem (with an imaging ratio in the range of β<0), and that the second subsystem images the intermediate image to a real system image in the wafer plane. In such structures, it is possible to have the plane for the object to be imaged located within the structural space of the entire mirror system, including the first, second, third, fourth and fifth mirrors.

In an embodiment of the invention, the aperture stop B lies on the first mirror. Alternatively, the freely accessible aperture stop can lie, both optically and physically, between the second and third mirrors.

In order to be able to make the necessary corrections of the imaging errors in the five-mirror systems, in a preferred embodiment, all five mirrors are aspherical. However, an alternative embodiment whereby at most four mirrors are aspherical, thus simplifying the manufacturing process, can be achieved. Then it is possible to make at least one mirror spherical, preferably the largest mirror.

In order to reach a resolution of at least 50 nm, the design part of the rms wave front part of the system should be at most 0.07 λ and preferably 0.03 λ.

Advantageously, in the examples of the invention, the objectives are always designed to be telecentric on the image-side. In projection systems which are operated with a reflection mask, a telecentric beam path on the object-side is not possible without illumination through a beam splitter which reduces transmission strongly such as known, for example, from JP-A-95 28 31 16. Therefore, the chief ray angles on the reticle are chosen so that vignetting-free illumination is possible. Alternatively, in systems with transmission masks, the projection objective can be telecentric on the object-side. Overall, the telecentricity error on the wafer should not exceed 10 mrad and typically is between 5 mrad and 2 mrad, with 2 mrad being preferred. This ensures that changes of the imaging ratio remain within tolerable limits over the focus.

In the embodiments of the invention, the projection objective is divided into two subsystems. The first subsystem is a reducing three-mirror system, preferably with imaging ratio (β) in range of −0.5>β>−1.0, and the second subsystem is a two-mirror subsystem.

In addition to the projection objective, the invention also provides a projection exposure apparatus, including at least one projection objective. In a first embodiment, the projection exposure apparatus has a reflection mask, while in an alternative embodiment, it has a transmission mask.

Furthermore, in a preferred embodiment, the projection exposure apparatus is an arc-shaped field scanner, and includes an illumination device for illuminating an off-axis arc-shaped field. Advantageously, the secant length of the scan slit is at least 26 mm and that the arc width is greater than 0.5 mm, so that homogenous illumination becomes possible.

The invention will be described below with the aid of drawings as examples.

DESCRIPTION OF THE PREFERRED EMBODIMENTS

Figure 1:
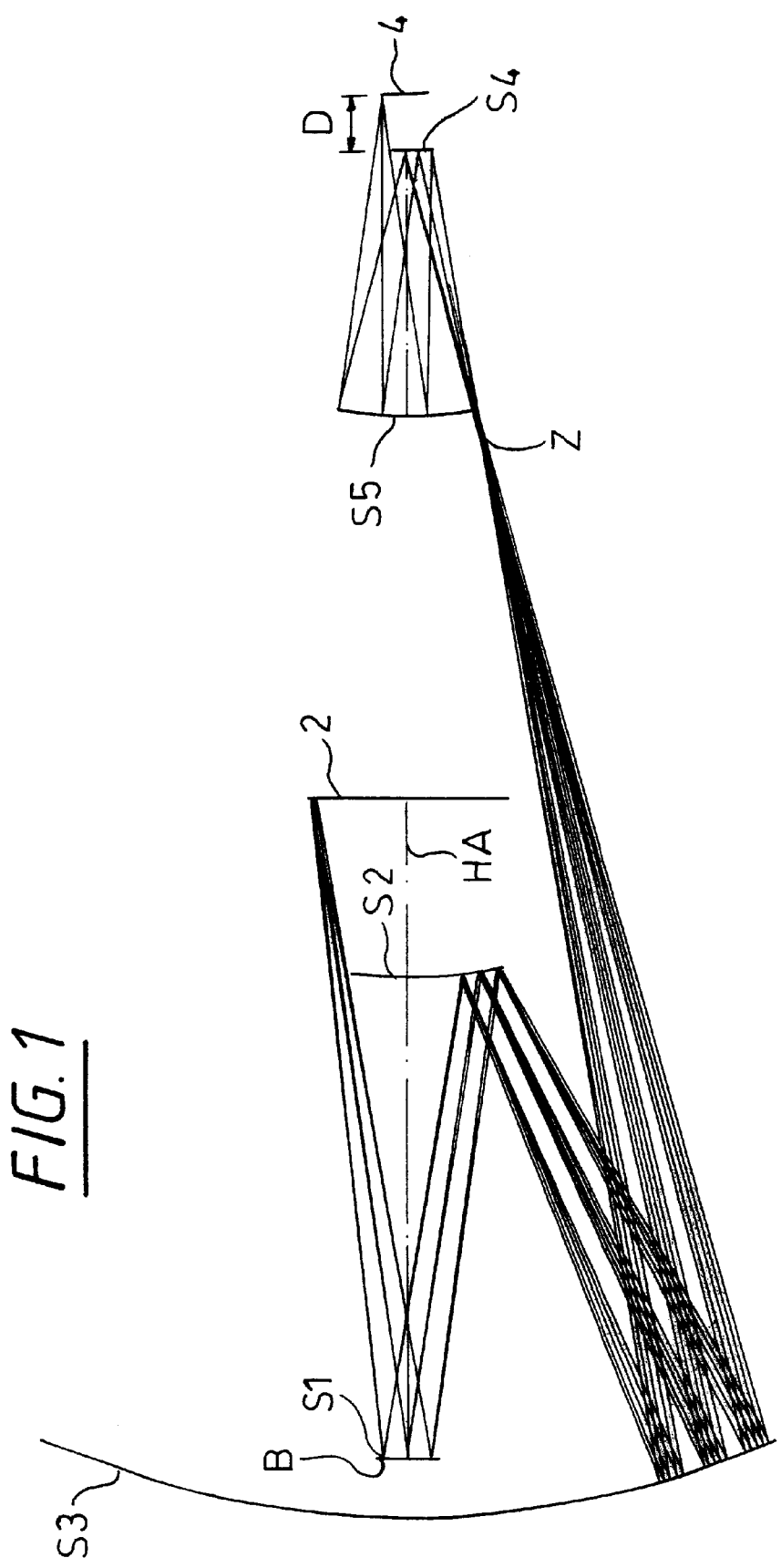
FIG. 1 is a first embodiment of the invention with a real intermediate image between the first and second subsystem.
Figure 2:
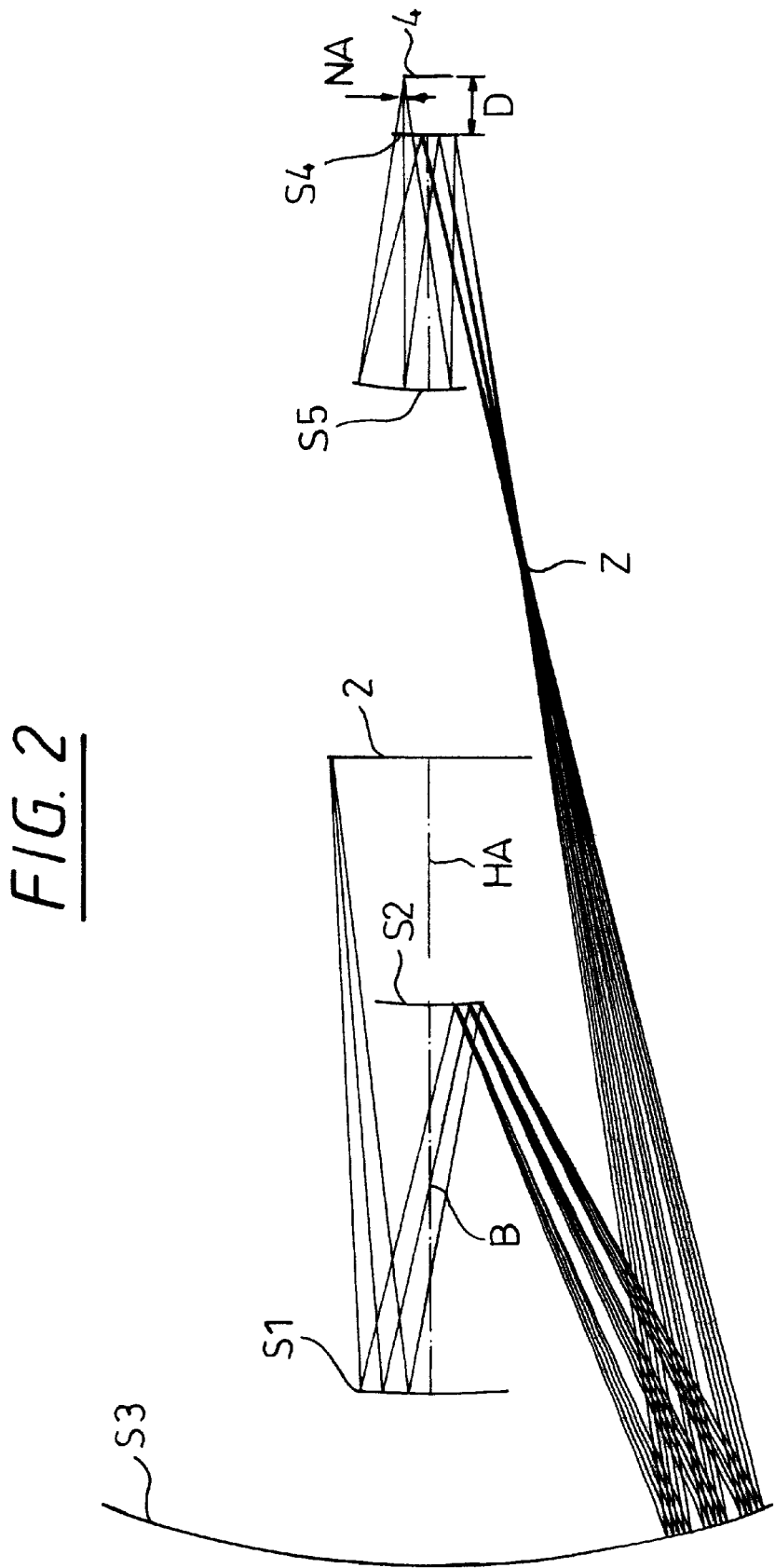
FIG. 2 is a second embodiment of the invention in which the aperture stop lies between the first and second mirror.

In FIGS. 1 and 2, preferred arrangements of the five-mirror projection objectives according to the invention are shown. Each has an optical free working distance that corresponds at least to the used diameter of the mirror closest to the wafer or object to be illuminated. In all embodiments below, the same reference numbers are used for the same components with the following nomenclature employed:

first mirror (S1), second mirror (S2), third mirror (S3), fourth mirror (S4), and fifth mirror (S5).

In particular, FIG. 1 shows a five-mirror projection objective with a beam path from the reticle plane 2 to the wafer plane 4. The embodiment can be considered as a series circuit with (1) a three-mirror system consisting of S1, S2 and S3, that produces a real, reduced image of the object, as the intermediate-image Z and (2) a two-mirror system S4, S5, which images the intermediate image Z in the wafer plane 4 while maintaining the telecentricity requirements. The aberrations of the subsystems are balanced against one another in such a way that the total system has sufficient quality for the application.

A physical aperture stop B is arranged on the first mirror S1. To block light from passing above the aperture stop B, a narrow ring is used to block the light reflected toward S2 from S1. In the embodiment shown in FIG. 1, the aperture is realized as an opening at the S1 mirror. The aperture stop can also be positioned between the mirror S1 and the mirror S2.

In the system according to FIG. 1, the optical free working distance D between the mirror next to the wafer plane 4, the fourth mirror S4 in the present embodiment, and the wafer plane 4 is greater than the used diameter of mirror S4, that is, the following condition is fulfilled:

optical distance from S4 to the wafer plane 4> used diameter S4. Other distance conditions are possible, for example, that the optical free working distance is greater than the sum of one-third of the used diameter of the mirror S4 nearest to the wafer plane 4 plus 20 mm or that the optical free working distance can be greater than 50 mm. In the embodiment of FIG. 1, the free optical working distance is 60 mm. Such an optical working distance guarantees sufficient free mechanical working distance, which is greater than 0, as well as the use of optical components with sufficient strength properties to be used at wavelengths <100 nm and preferably of 11 or 13 nm.

The optical components for a wavelength of $\lambda=13$ nm and $\lambda=11$ nm include, for example, Mo/Si and Mo/Be multilayer coating systems, respectively, where the typical multilayer coating systems for $\lambda=13$ nm are 40 Mo/Si layer pairs, while the Mo/Be systems that are suitable for $\lambda 11$ nm have approximately 70 layer pairs. Reflectivities of such systems lie in the range of approximately 70%. In the multilayer coating systems, layer stresses of above 350 MPa and more may occur. Stresses of such values may induce surface deformation, especially in the edge regions of the mirror.

The systems according to the invention, as shown as an example in FIG. 1, have:

$$RES=k_1\lambda/NA.$$

This results in a nominal resolution of at least 50 nm and 35 nm at a minimum numerical aperture of NA=0.15 for $k_1=0.57$ and $\lambda=13$ nm, and $k_1=0.47$ and $\lambda=11$ nm, respectively, where $k_1$ is a parameter specific for the lithographic process.

Furthermore, the beam path of the objective shown in FIG. 1 is obscuration-free. For example, in order to produce image formats of 26×34 mm² or 26×52 mm², the projection objectives according to the invention are preferably used in an arc-shaped field scan projection exposure apparatus, where the secant length of the scan slit is at least 26 mm.

Numerous types of mask can be used in the projection exposure apparatus, including transmission masks, stencil masks, and reflection masks, and the system, which is telecentric on the image-side can be telecentric or not telecentric on the object-side. For example, to form a telecentric beam path on the object-side, when using a reflection mask, a transmission-reducing beam splitter must be employed. With a beam path not telecentric on the object-side, unevenness of the mask will not lead to scaling errors in the image. The main beam angles at the reticle plane 2 are therefore preferably less than 10°, so that the requirements for reticle evenness lie in technologically realizable range. Moreover, the system according to FIG. 1 has an image-side telecentering error on the wafer plane 4 of 3±0.1 mrad at a numerical aperture of 0.15.

In the embodiment shown, all mirrors S1–S5 are aspherical, and the maximum asphericity in the used area lies at 14 $\mu$m. The maximum asphericity occurs on mirror S3. The low asphericity of the arrangement is advantageous from a manufacturing point of view, since the technological difficulties in producing of the surfaces of the multilayer mirror increase with the aspherical deviation and increasing gradient of the asphere.

The highest angle of incidence in the arrangement according to FIG. 1 occurs at S2 and is 18.9°. The wavefront error of the arrangement is better than 0.023 $\lambda$ in the 2 mm wide arc-shaped field at $\lambda=13$ nm.

With the embodiments shown in FIGS. 1 and 2, the disadvantage of a mirror system with an odd number of mirrors, namely that a stretched structure reticle-projection optics-wafer can no longer be realized, is overcome. This disadvantage results from the fact that the reticle plane and the wafer plane were illuminated from the same direction especially in the case of systems with near normal incidence. This condition led to the reticle plane and the wafer plane lying on the same side of the objective.

According to FIG. 1 or 2, the reticle plane 2 is placed within the projection system. The mirror arrangement is chosen so that, in the direction of the optical axis, the structural space provided for the reticle stage, within the projection system, is as large as possible, preferably 400 mm. In addition, the plane of the object, i.e., the reticle, has a sufficiently large distance to the light bundles traveling in the objective. This ensures that a sufficiently large object, i.e., reticle, can be scanned in an annular field scanning operation. In a preferred example, approximately 200 mm can be scanned on the reticle, corresponding to 50 mm on the wafer.

In the embodiment shown in FIG. 1, the two mirrors of the two-mirror subsystem (S4, S5) have approximately the same radii R, within a few percent, and the distance between the two of the two oblate ellipsoidal mirrors is approximately R/$\sqrt{2}$. The three-mirror subsystem near the reticle plane 2 consists of three almost concentric mirrors (S1, S2, S3) of which the primary (S1) and the tertiary mirror (S3) have similar radii. The subsystem near the reticle plane 2 differs from a disturbed Offner system mainly by the position of the aperture stop B on the primary mirror and the non-telecentric beam path on the reticle.

A real intermediate image Z is produced between the two subsystems. The chief-ray angle inclination on the reticle plane 2 permits a vignetting-free illumination of a reflection mask. Furthermore, in the embodiments according to FIGS. 1 and 2, the distances between the mirrors are chosen to have a value such that the mirrors can be sufficiently thick so that the required strength properties are still obtained at the high layer stresses that occur.

The parameters of the systems shown in FIG. 1 are given in Table 1 in Code V (™) nomenclature. The objective is a 4× system with a 26×2 mm² arc-shaped field and a numerical aperture NA of 0.15. The mean image-side radius of the system is approximately 26 mm.

TABLE 1

| element number | radius | thickness | diameter | type |
|---|---|---|---|---|
| object | INF | −693.4069 | | |
| | | | 52.0652 | |
| | | 354.7680 | | |
| | | | 135.9392 | |
| | | −92.4573 | | |
| | | | 114.0805 | |
| | | −262.3106 | | |
| | | aperture | 52.0652 | |
| | | 0.0000 | | |
| 1 | A(1) | 354.7680 | | |
| | | | 52.1468 | REFL |
| | | | 150.4663 | |
| | | 148.5214 | | |
| | | | 191.7567 | |
| | | 0.0000 | | |
| 2 | A(2) | −148.5214 | 194.3744 | REFL |
| | | | 375.2582 | |
| | | −415.6887 | | |
| 3 | A(3) | 564.2101 | 763.1343 | REFL |
| | | | 488.5602 | |
| | | 590.1176 | | |
| | | | 161.9611 | |
| | | 276.5162 | | |
| 4 | A(4) | −276.5162 | 56.7269 | REFL |
| 5 | A(5) | 276.5162 | 150.9852 | REFL |
| | | | 71.4698 | |
| image | image width | 59.0000 | | |
| | | | 54.0239 | |

Asphericity constants:

$$Z = \frac{(CURV)Y^2}{1 + (1 - (1 + K)(CURV)^2 Y^2)^{1/2}} + (A)Y^4 + (B)Y^6 + (C)Y^8 + (D)Y^{10}$$

| asphere | CURV | K | A | B | C | D |
|---|---|---|---|---|---|---|
| A(1) | 0.00101481 | 5.839224 | 0.00000E+00 | 3.87962E−14 | 4.75060E−18 | −3.72457E−22 |
| A(2) | 0.00199897 | −1.309152 | 0.00000E+00 | 2.41371E−15 | 1.33811E−19 | −4.72546E−24 |
| A(3) | 0.00101913 | −0.062382 | 0.00000E+00 | −4.60126E−18 | 2.36912E−23 | −4.12881E−29 |
| A(4) | 0.00276967 | 9.874573 | 0.00000E+00 | −3.75169E−13 | 2.32666E−17 | −7.34689E−21 |
| A(5) | 0.00276492 | 0.076718 | 0.00000E+00 | 2.43566E−17 | −1.36024E−20 | 1.02666E−25 |

Reference wavelength = 13 nm

FIG. 2 shows an alternative embodiment of the invention of a five-mirror system in which the aperture stop B is between the first mirror and the second mirror. The same components as in FIG. 1 are assigned the same reference numbers.

The optical free working distance at the wafer plane 4 is approximately 60 mm in this embodiment, and thus it is larger than the used diameter of the mirror S4, which is closest to the wafer plane 4. In contrast to the embodiment according to FIG. 1, in FIG. 2 the aperture stop B is placed physically between the first and second mirrors so that it is freely accessible. The wavefront error is 0.024 λ, within the 1.7 mm wide arc-shaped field at λ=13 nm.

Table 2 shows the constructional data of the 4× objective according to FIG. 2 in Code V (™) nomenclature. The mean radius of the 26×1.7 mm² is again 26 mm and the aperture NA=0.15.

TABLE 2

| element number | radius | thickness | diameter | type |
|---|---|---|---|---|
| object | INF | −693.4069 | | |
| | | | 154.7165 | |
| | | 354.7645 | | |
| | | | 186.0707 | |
| | | −92.4523 | | |
| | | | 177.8997 | |
| | | −262.3122 | | |
| | | | 154.7165 | |
| | | −0.0000 | | |

TABLE 2-continued

| | | | | |
|---|---|---|---|---|
| 1 | A(1) | 236.0296 | 155.0648 | REFL |
| | | | 37.8314 | |
| | | 0.0000 aperture | 37.8314 | |
| | | 184.2473 | | |
| 2 | A(2) | −168.2690 | 108.2091 | REFL |
| | | | 290.4780 | |
| | | −435.4421 | | |
| 3 | A(3) | 603.7111 | 685.3018 | REFL |
| | | | 431.6713 | |
| | | 673.5394 | | |
| | | | 148.3568 | |
| | | 275.3310 | | |
| 4 | A(4) | −275.3310 | 61.3839 | REFL |
| 5 | A(5) | 275.3310 | 153.1871 | REFL |
| | | | 72.9358 | |
| | | 63.1295 | | |
| image | image width | | 54.0638 | |

Asphericity constants:

$$Z = \frac{(CURV)Y^2}{1 + (1 - (1 + K)(CURV)^2 Y^2)^{1/2}} + (A)Y^4 + (B)Y^6 + (C)Y^8 + (D)Y^{10}$$

| asphere | CURV | K | A | B | C | D |
|---|---|---|---|---|---|---|
| A(1) | 0.00130732 | 0.130035 | 0.00000E+00 | 1.69206E−15 | −1.65350E−19 | 8.14629E−24 |
| A(2) | 0.00277574 | 0.091769 | 0.00000E+00 | −7.44262E−14 | 2.28766E−17 | −2.87177E−21 |
| A(3) | 0.00102490 | −0.014023 | 0.00000E+00 | −2.96927E−17 | 1.64882E−22 | −3.87456E−28 |
| A(4) | 0.00210508 | 12.753039 | 0.00000E+00 | −8.13887E−14 | −1.07272E−16 | 3.55319E−20 |
| A(5) | 0.00262203 | 0.142491 | 0.00000E+00 | 3.75109E−17 | −3.86791E−20 | −3.22849E−24 |

Reference wavelength = 13 nm

Figure 3A:
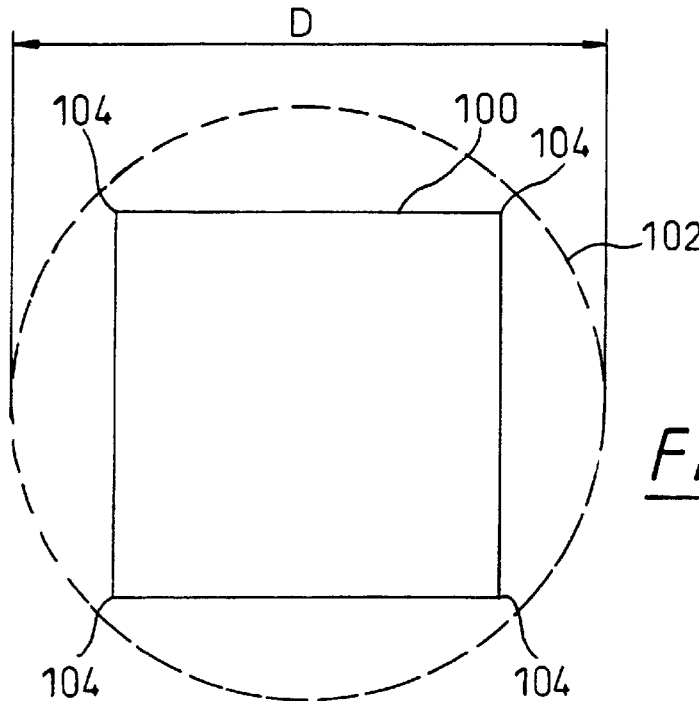
FIGS. 3A and 3B show the used diameter for differently illuminated light fields.
Figure 3B:
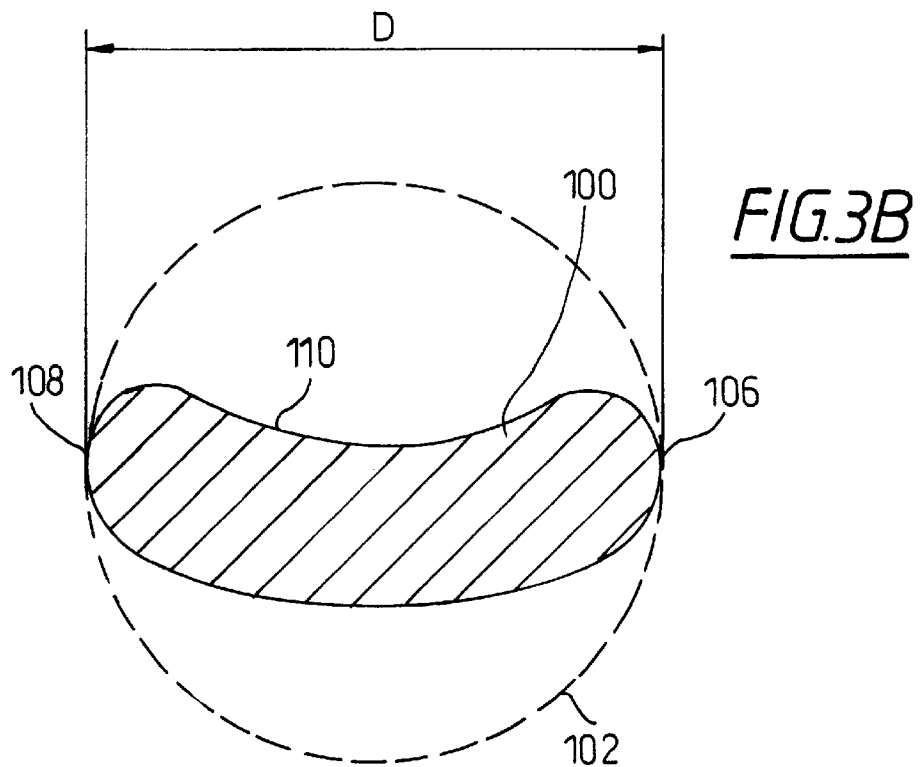

FIGS. 3A and 3B illustrate the meaning of the used diameter D in the present application. As an example, let the illuminated field 100 on a mirror in FIG. 3A be a rectangular field. The used diameter D is then the diameter of the envelope circle 102, which encompasses the rectangle 100, where the corners 104 of the rectangle 100 lie on the envelope circle 102.

FIG. 3B shows a second example. The illuminated field 100 has a kidney shape, as expected for the useful range when using the objective according to the invention in a microlithography projection exposure apparatus. The envelope circle 102 encompasses the kidney shape fully and coincides with the edge 110 of the kidney shape at two points 106, 108. The used diameter D is then the diameter of the envelope circle 102.

Thus, with the invention, a five-mirror projection objective is given for the first time, with an imaging scale of preferably 4×, 5× as well as 6× for preferred use in an EUV arc-shaped projection system. The projection objection has the necessary resolution for the required image field and provides conditions that make functional structural design possible, since the aspheres are sufficiently mild, the angles are sufficiently small for the layers and the structural spaces for the mirror carriers are sufficiently large.

What I claim is:

1. A projection objective for use in short wavelength microlithography to image an object onto a wafer plane, comprising:

a first mirror (S1), a second mirror (S2), a third mirror (S3), a fourth mirror (S4), and a fifth mirror (S5) such that the projection objective comprises a first subsystem and a second subsystem and wherein the object is imaged by a first subsystem, formed of the first mirror, the second mirror, and the third mirror (S1, S2, S3) with an imaging ratio (β) less than 0, into a real intermediate image (Z), and wherein a second subsystem, formed of the fourth mirror and the fifth mirror (S4, S5), images the intermediate image as a real system image in the wafer plane.

2. The projection objective of claim 1, wherein the first mirror (S1), the second mirror (S2), the third mirror (S3), the fourth mirror (S4), and the fifth mirror (S5) are arranged such that the image-side numerical aperture (NA) is $NA \geq 0.10$, the arc-shaped field width (W) at the wafer plane lies in the range of $W \geq 1.0$ mm, and the peak-to-valley deviation (A) of the aspheres in comparison to the best-fitting sphere in the used area is limited on all mirrors by $A \leq 24 \, \mu m - 129 \, \mu m (0.20 - NA) - 2.1 \, [\mu m/mm](2 \, mm - W)$.

3. The projection objective of claim 1, wherein the first mirror (S1), the second mirror (S2), the third mirror (S3), the fourth mirror (S4), and the fifth mirror (S5) are arranged such that the image-side numerical aperture (NA) is at least 0.10, the image-side width of the arc-shaped field (W) at the wafer plane is at least 1.0 mm, and the angle of incidence (AOI) on all mirrors are in the range:

$AOI \leq 22° - 2°(0.20 - NA) - [0.3°/mm](2 \, mm - W)$, where the angle of incidence is measured for any given mirror relative to the surface normal of that mirror.

4. The projection objective of claim 1, wherein
the first mirror (S1), the second mirror (S2), the third mirror (S3), the fourth mirror (S4), and the fifth mirror (S5) are arranged such that the image-side numerical aperture (NA) is at least 0.10, and an object plane, where the object is located, is within the structural space of a mirror system consisting of the first mirror, second mirror, third mirror, fourth mirror and fifth mirror.

5. The projection objective according to claim 1, wherein the first subsystem is disposed near the object and that the second subsystem is disposed near the wafer plane.

6. The projection objective according to claim 4, wherein the mirrors are arranged in such a way that there is sufficient lateral structural space provided for a scan of the object plane so that an obscuration-free beam path is achieved.

7. The projection objective according to claim 4, wherein the mirrors are arranged in such a way that there is sufficient axial structural space for a scan of the object plane so that an obscuration-free beam path is achieved.

8. The projection objective according to claim 1, wherein the fourth mirror and the fifth mirror have substantially the same radii (R).

9. The projection objective according to claim 8, wherein the distance between the fourth mirror and the fifth mirror is approximately
$$\frac{R}{\sqrt{2}}.$$

10. The projection objective according to claim 1, wherein the mirror surfaces are arranged on surfaces which exhibit rotational symmetry with respect to a principal axis (PA).

11. The projection objective according to claim 1, further comprising an aperture stop (B) arranged on the body of the first mirror (S1).

12. The projection objective according to claim 1, wherein the aperture stop lies between the first mirror and second mirror so that it is freely accessible.

13. The projection objective according to claim 1, wherein at least four mirrors are aspherical.

14. The projection objective according to claim 13, wherein all mirrors are aspherical.

15. The projection objective according to claim 1, wherein the imaging ratio ($\beta$) of the first subsystem is between −0.5 and −1.0.

16. The projection objective according to claim 1, wherein the rms wavefront error of the objective is at most 0.07 $\lambda$ over an entire image field.

17. The projection exposure apparatus with a microlithography projection objective according to claim 1, further comprising an illumination device for illuminating an arc-shaped field.

\* \* \* \* \*